United States Patent
Toyama et al.

(10) Patent No.: US 6,821,683 B2
(45) Date of Patent: Nov. 23, 2004

(54) METHOD FOR CORRECTING DESIGN PATTERN OF SEMICONDUCTOR CIRCUIT, A PHOTOMASK FABRICATED USING THE CORRECTED DESIGN PATTERN DATA, A METHOD FOR INSPECTING THE PHOTOMASK AND A METHOD FOR GENERATING PATTERN DATA FOR INSPECTION OF PHOTOMASK

(75) Inventors: Nobuhito Toyama, Tokyo (JP); Naoki Shimohakamada, Tokyo (JP); Wakahiko Sakata, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 7 days.

(21) Appl. No.: 09/961,798

(22) Filed: Sep. 24, 2001

(65) Prior Publication Data
US 2002/0110742 A1 Aug. 15, 2002

(30) Foreign Application Priority Data
Sep. 26, 2000 (JP) ........................................ 2000-292296

(51) Int. Cl.$^7$ ................................................ G03F 9/00
(52) U.S. Cl. ........................................................ 430/5
(58) Field of Search ........................... 430/5, 311, 313; 716/19, 20

(56) References Cited

U.S. PATENT DOCUMENTS

| 6,421,820 B1 | * | 7/2002 | Mansfield et al. ............. 716/21 |
| 6,444,373 B1 | * | 9/2002 | Subramanian et al. .......... 430/5 |
| 6,453,274 B2 | * | 9/2002 | Kamon .......................... 703/2 |
| 6,560,767 B2 | | 5/2003 | Toyama et al. ................ 716/21 |
| 2002/0075028 A1 | | 6/2002 | Toyama ........................ 716/21 |

OTHER PUBLICATIONS

Photomask and X–Ray Mask Technology VI, Proceedings of SPIE, vol. 3748, Schellenberg and LaCour, Apr. 13–14, 1999, pp. 249–258 (11 sheets).

* cited by examiner

Primary Examiner—S. Rosasco
(74) Attorney, Agent, or Firm—Flynn, Thiel, Boutell & Tanis, P.C.

(57) ABSTRACT

A method for correcting design pattern data of a semiconductor circuit in which, in the middle of miniaturization and high density of a mask pattern being developed, a technique of correction is applied at a practical level in which the correction of design pattern data in the formation of fine patterns on a semiconductor wafer is associated with the correction of design patterns in the fabrication of a photomask.

10 Claims, 6 Drawing Sheets

(a)

(b)

(c)

(a)

(b)

(c)

(a)

(b)

(c)

(d)

(e)

(a)

(b)

(a)

(b)

(a)

(b)

(c)

METHOD FOR CORRECTING DESIGN PATTERN OF SEMICONDUCTOR CIRCUIT, A PHOTOMASK FABRICATED USING THE CORRECTED DESIGN PATTERN DATA, A METHOD FOR INSPECTING THE PHOTOMASK AND A METHOD FOR GENERATING PATTERN DATA FOR INSPECTION OF PHOTOMASK

BACKGROUND OF THE INVENTION

1. Field of the Invention

The present invention relates to the treatment of correction of design pattern data for fabrication of photomask, which is needed following the miniaturization and high density of patterns on a semiconductor wafer, and in particular relates to a method for correcting design pattern data used for forming a pattern of photomask so as to obtain the objective shape of a figure pattern on a wafer and a photomask having patterns corrected by the method for correcting design pattern data.

2. Related Art

Recently, improved integration and functionality have been desired for various LSIs typified by ASIC. Namely, it is desired to decrease chip size as much as possible to realize high functionality.

The above-mentioned LSIs such as ASIC are produced through several steps of making figure data which are called "pattern data" for forming patterns of a photomask through function design, logical design, circuit design and layout design and others, fabricating a photomask using the figure data, and thereafter transferring the patterns of photomask on a wafer by demagnification projection to carry out the fabrication of a semiconductor circuit.

A photomask is produced generally by drawing the above-mentioned figure data (pattern data) on photosensitive resist put on a shielding film of a substrate for photomask (also called "photomask blanks") using an electron beam exposure system or aligner of photo such as excimer laser, and through the steps of development and etching.

Namely, photosensitive resist is applied on a shielding metallic thin film provided on a glass substrate and dried. A latent image is formed on the photosensitive resist by applying ionizing radiation only to the fixed, areas, and the photosensitive resist is developed to obtain the resist patterns having a desired shape corresponding to the exposure areas of ionizing radiation. Thereafter, the metallic thin film is etched into the shape of the resist pattern by using the resist pattern as etching resistant resist, by which a photomask having a desired metallic thin film is formed.

In the case where patterns of photomask are exposed onto a wafer by demagnification projection to transfer the patterns to the wafer, the photomask is also called "reticle mask".

In such a way, patterns of photomask are transferred onto a wafer by demagnification projection by which circuit patterns are formed on a wafer. However, there is a case where patterns are not formed onto a wafer with the same size as the patterns of photomask according to the design conditions because together with LSI being more integrated, recently the size of the exposed shape (size of the exposed shape on a wafer) has miniaturized more and more to the extent that the size of the exposed shape approaches the wavelength of an exposed beam or the size of an exposed shape is smaller than the wavelength of the exposed beam so that transformation of the shape of exposed beam called "optical proximity effect" is generated when transferring patterns of photomask on a wafer through demagnification projection. Accordingly, there is a case where even if patterns formed on a photomask have the same size, patterns corresponding to the patterns formed on the photomask are not formed on a semiconductor wafer with the same size as the size of patterns of the photomask according to design conditions.

In such a way, a difference between figure patterns of the photomask and the patterns formed on a wafer corresponding to the figure patterns of the photomask are produced. Therefore, it is necessary to change the shape of the photomask according to the objective shape of the figures formed on the wafer.

Thus it is now necessary to use figure data in which correction is given to original figure data (hereinafter it is called "design pattern data") for the fabrication of the photomask.

Further, a difference between figure data used and figures on a photomask corresponding to the figure data has started to be problematic.

In such a way, the correction of design pattern data in the formation of fine patterns on a semiconductor wafer and the correction of design pattern data in the fabrication of photomask came to be applied.

First, referring to drawings, the technique of correction of design pattern data in the formation of fine patterns on a semiconductor wafer is explained concretely.

FIG. 3(a) shows design pattern data. FIG. 3(b) shows an example of patterns formed on a semiconductor wafer in case of the size of the design pattern being smaller than the wavelength of a light source of aligner for production of a semiconductor.

This shows that a difference in angles and width of line of design patterns appears according to the phenomenon of optical diffraction.

The technique of lessening the difference has been carried out actively from the latter half of the 1990's.

FIG. 6(a) shows corrected pattern data in which correction is given to design patterns applied until now. The correction shown in FIG. 6(a) is for the design patterns shown in FIG. 3(a) to form a corrected design pattern.

The shapes of patterns formed on a semiconductor wafer become the shape close to a desired shape as design patterns formed on a wafer shown in FIG. 6(b), using the corrected design pattern data.

Further, when forming design patterns on a semiconductor wafer, deviation from the correct shape of patterns arise according to the position of the pattern within an individual chip as a unit of exposure of the semiconductor, due to a process of semiconductor.

FIG. 3(b) shows an example in which figure 153 becomes thinner by the influence of position.

As for the deviation from the correct shape of a pattern depending on the position of a pattern generated within a chip of a unit of exposure of the semiconductor, the correction of a design pattern is difficult. Therefore, the correction of a design pattern for controlling deviation is not applied according to a general rule.

Then, referring to drawing, the correction of a design pattern in the production of a photomask is explained.

FIG. 4(a) shows design pattern data. FIG. 4(b) shows the shape of figure patterns formed on a photomask corresponding to the design pattern data shown in FIG. 4(a).

Deviation of the roundness of the shape of the pattern formed on a photomask shown in FIG. 4(b) and deviation of the width of line of the pattern depend on arrangement of the design patterns and the steps of producing a photomask.

Accordingly, in order to make patterns formed on the photomask approach to the shape of design pattern, a use of corrected design pattern data corrected as shown in FIG. 7(a) was suggested.

FIG. 7(b) shows the shape of figure patterns formed on a photomask corresponding to the corrected design pattern.

Further, as shown in FIG. 4(b), there is the problem that a difference between pattern data and the shape of figure patterns formed on a photomask arises according to the position of a pattern within the photomask.

As for a difference between the pattern data and the shape of figure patterns depending on the position of the pattern within a photomask generated in the production of photomask, the correction of design pattern is difficult. Therefore, the correction of the design pattern for controlling the difference is not applied in a general rule.

The application of both the technique of correction of design pattern in the fabrication of a photomask and the technique of correction of design pattern in producing a semiconductor wafer is needed for obtaining both the shape of figure patterns of the photomask close to the objective shape of the pattern and the shape of figure patterns formed on a semiconductor wafer close to the objective shape of the pattern. However, heretofore, first, the correction of a design pattern for semiconductor wafer was applied, then, the correction of a design pattern for a photomask was carried out since the amounts of correction in a semiconductor wafer is larger than that for photomask in general.

An original design pattern is as shown in FIG. 8(a), the correction of design pattern for semiconductor wafer is as shown in FIG. 8(b) and the correction of design pattern for photomask is as shown in FIG. 8(c).

In this case, if original design pattern is assumed to be a rectangle as shown in FIG. 8(a), the correction of design pattern for a semiconductor wafer is made to form a figure having twenty edges as shown in FIG. 8(b), and the correction of design pattern for the photomask is made to be a figure having one hundred edges as shown in FIG. 8(c).

However, such a correction is not realistic. It can be imagined that an actual time to carry out the correction of the design pattern and the amounts of data generated after the correction of the design pattern becomes enormous. Further, there is no information on the technique of correction in which the correction of the design pattern for the semiconductor wafer is associated with the correction of design pattern for the photomask.

However today, patterns formed on semiconductor wafers are finer and finer and in case of the correction of a design pattern being carried out by the prior art, the above-mentioned two corrections become essential.

The necessity for consideration of a difference between original figure data and patterns formed on a photomask corresponding to the original data and a difference between the original figure data and patterns formed on a wafer corresponding to the original figure data appeared recently. Therefore, a practical application of the technique of correction was required in which the correction of design pattern data in the formation of fine patterns on a semiconductor wafer is associated with the correction of design pattern data in the fabrication of photomask.

SUMMARY OF THE INVENTION

According to this, it is an object of the present invention to provide a method for correcting design pattern data for semiconductor circuit in which recently, in the middle of miniaturization and the high density of mask patterns being developed, the technique of correction is applied at a practical level in which the correction of design pattern data in the formation of fine patterns on a semiconductor wafer is associated with the correction of design patterns in the fabrication of photomask.

Namely, it is an object of the present invention to provide a method for correcting design pattern data for a semiconductor circuit in which the process of correction is possible within a practical time without the amounts of data to be processed becoming enormous.

Further, it is another object of the present invention to provide a photomask and a method for inspecting thereof in which figure data (pattern data) is used so that the above-mentioned correction of data is given.

A method for correcting design pattern data of a semiconductor circuit of the present invention is a method for correcting design pattern data in the fabrication of semiconductor in which figure patterns are formed on a semiconductor wafer using design pattern data designed for the semiconductor circuit and transferring the figure pattern of a photomask from a photomask to a semiconductor wafer by exposure, characterized in that the method for correcting design pattern data of the semiconductor circuit comprises the steps of: (a) extracting a difference between particular pattern data and figure patterns formed on a semiconductor wafer, wherein said figure patterns corresponding to said pattern data comprised of test pattern data or said pattern data comprised of test pattern data and design pattern data are formed on said semiconductor wafer, using a photomask with the high fidelity in which there is a no or very small difference between pattern data and figure patterns of photomask, according to the specified method for fabricating a semiconductor and said figure patterns formed on a semiconductor wafer are measured by which a difference between said pattern data and said figure patterns of semiconductor wafer is extracted; (b) extracting a difference between said pattern data and figure patterns formed on a photomask, wherein said figure patterns corresponding to said pattern data is formed on the photomask according to the specified method for fabricating a photomask and said figure patterns formed on a photomask is measured by which a difference between said pattern data and said figure patterns formed on the photomask is extracted; (c) deriving the amounts of correction, wherein the amounts of correction to transform the shape of said pattern data is derived on the basis of the information on differences extracted from said step of extracting the difference between said pattern data and said figure patterns formed on a photomask and said step of extracting the difference between said pattern data and said figure patterns formed on a semiconductor wafer in such a manner that the difference between said pattern data and said figure patterns of semiconductor wafer becomes smaller; and (d) applying the correction, wherein the shape of design pattern data is corrected using the amounts of correction derived from the step of deriving the amounts of correction by which the corrected design pattern data is generated.

Or a method for correcting design pattern data of semiconductor circuit of the present invention is a method for correcting design pattern data in the fabrication of semiconductor in which figure patterns are formed on a semiconductor wafer using design pattern data designed for semiconductor circuit and transferring the figure pattern data from a photomask to a semiconductor wafer by exposure, characterized in that the method for correcting design pattern data comprises the steps of: (a) extracting a difference between particular pattern data and figure patterns formed on a semiconductor wafer, which corresponding to said pattern data comprised of test pattern data or said pattern data comprised of test pattern data and the design pattern data, are obtained by simulation on the assumption that photomask is fabricated in high fidelity to said pattern data; (b) extracting a difference between said pattern data and figure patterns formed on photomask, wherein figure patterns corresponding to said pattern data are formed on photomask using said pattern data and according to the specified method for fabricating photomask and said figure patterns formed on photomask is measured by which a difference between said pattern data and said figure patterns formed on the photomask is extracted; (c) deriving the amounts of correction, wherein the amounts of correction to transform the shape of said pattern data is derived on the basis of the information on differences extracted from said step of extracting a difference between said pattern data and said figure patterns formed on photomask and from the step of extracting a difference between said pattern data and said figure patterns formed on a semiconductor wafer in such a manner that a difference between said pattern data and said figure patterns of semiconductor wafer corresponding to said pattern data becomes smaller; and (d) applying the correction of design pattern data, wherein the shape of design pattern data is corrected using the amounts of correction derived from said step of deriving the amounts of correction by which the corrected design pattern data are generated.

A photomask of the present invention is characterized in that the photomask is fabricated using the corrected design pattern data formed in the step of applying the correction of design pattern data in any of the above-mentioned methods for correcting design pattern data.

A method for generating pattern data for the inspection of photomask in which the method is used for the inspection of photomask fabricated using the corrected design pattern data generated in the step of applying the correction of design pattern data mentioned in any of the above-mentioned method for correcting design pattern data, characterized in that the method for generating pattern data for the inspection of photomask comprises of the steps of: (e) extracting the amounts of transformation of photomask patterns, wherein the amounts of transformation of photomask patterns against pattern data are extracted from the information obtained from the step of extracting a difference between particular pattern data and figure patterns formed on photomask mentioned in any of the above-mentioned methods for correcting design pattern data; (f) forming transformed pattern data, wherein transformed design pattern data to which design pattern data is transformed against the corrected design pattern data generated in the step of applying correction of design pattern data mentioned in any of the above-mentioned methods for correcting design pattern data are generated on the basis of the amounts of transformation extracted in the step of extracting the amounts of transformation of photomask pattern; and (g) generating inspection data, wherein the inspection data for inspecting fabricated photomask are formed from transformed design pattern data generated in the step of forming transformed pattern data using the corrected design pattern data.

A method for inspecting a photomask of the present invention is characterized in that photomask fabricated using the corrected design pattern data generated in the step of correcting correction is inspected using the pattern data for inspection of photomask generated as above-mentioned, wherein the pattern data for inspection of photomask is compared with the formed patterns of photomask.

According to the above-mentioned constitution of invention, a method for correcting design pattern (data) of semiconductor circuit of the present invention enables the provision of a method for correcting design pattern data of semiconductor circuit, wherein recently, in the middle of miniaturization and high density of mask pattern being developed, the technique of correction is applied at a practical level in which the correction of design pattern data in the formation of fine patterns on a semiconductor wafer is associated with the correction of design patterns in the fabrication of photomask.

Namely, the present invention provides a method for correcting design pattern data of semiconductor circuit, wherein the process of correction is possible within practical time without the amounts of data to be processed being too enormous.

The details are as follows. In the present invention, the premise that ideal photomask with no difference between design pattern data generated by simulation and figure patterns formed on photomask is not made since a difference between design pattern data and figure patterns formed on semiconductor wafer is combined with a difference between design pattern data and figure patterns formed on photomask. Therefore, the load of production of photomask is decreased.

Further, the correction for fabricating ideal photomask is not needed. Therefore, the correction of design pattern data can be realized with the realistic amounts of data and within realistic time to treat the correction of design pattern data.

According to the above-mentioned constitution of invention, a method for generating pattern data for inspection of photomask of the present invention enables the provision of data for inspection of fabricated photomask, from the corrected design pattern data generated in a method for correcting design pattern data of semiconductor circuit of the above-mentioned present invention in which the correction of design pattern data is added. Finally, the fabrication of photomask and the process of inspection thereof can be established in which the objective figure patterns can be formed on semiconductor wafer faithfully to original design pattern data, by which the production of photomask is made at a practical level.

PREFERRED EMBODIMENT OF THE INVENTION

Referring to figures, one example of mode of working of a method for correcting design pattern (data) of semiconductor circuit of the present invention is explained.

Figure 1:
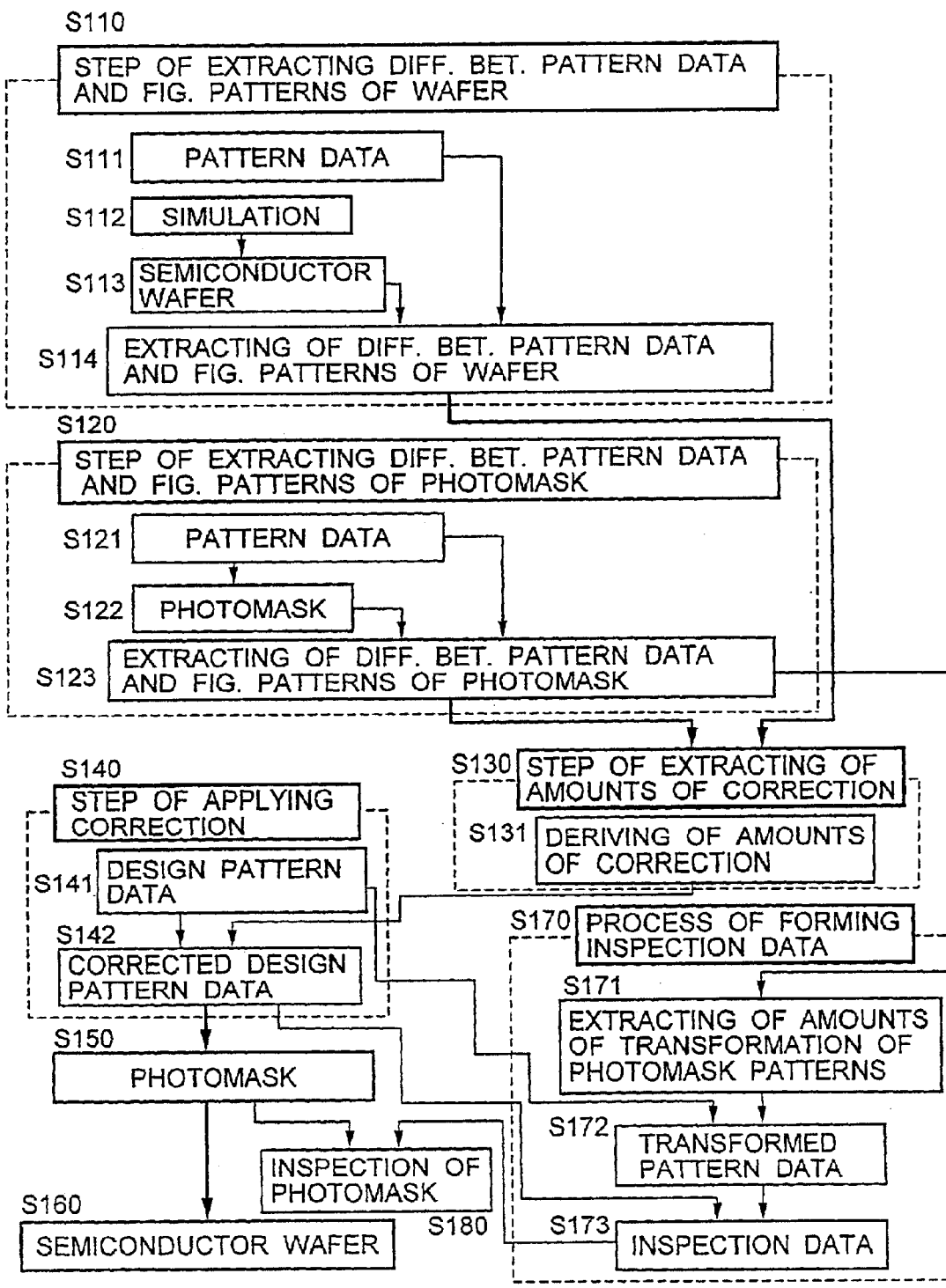
FIG. 1 is a view for illustrating a flow chart of a first example of mode of working of a method for correcting design pattern data of semiconductor circuit of the present invention and an example of the steps of forming inspection data of photomask.
Figure 2:
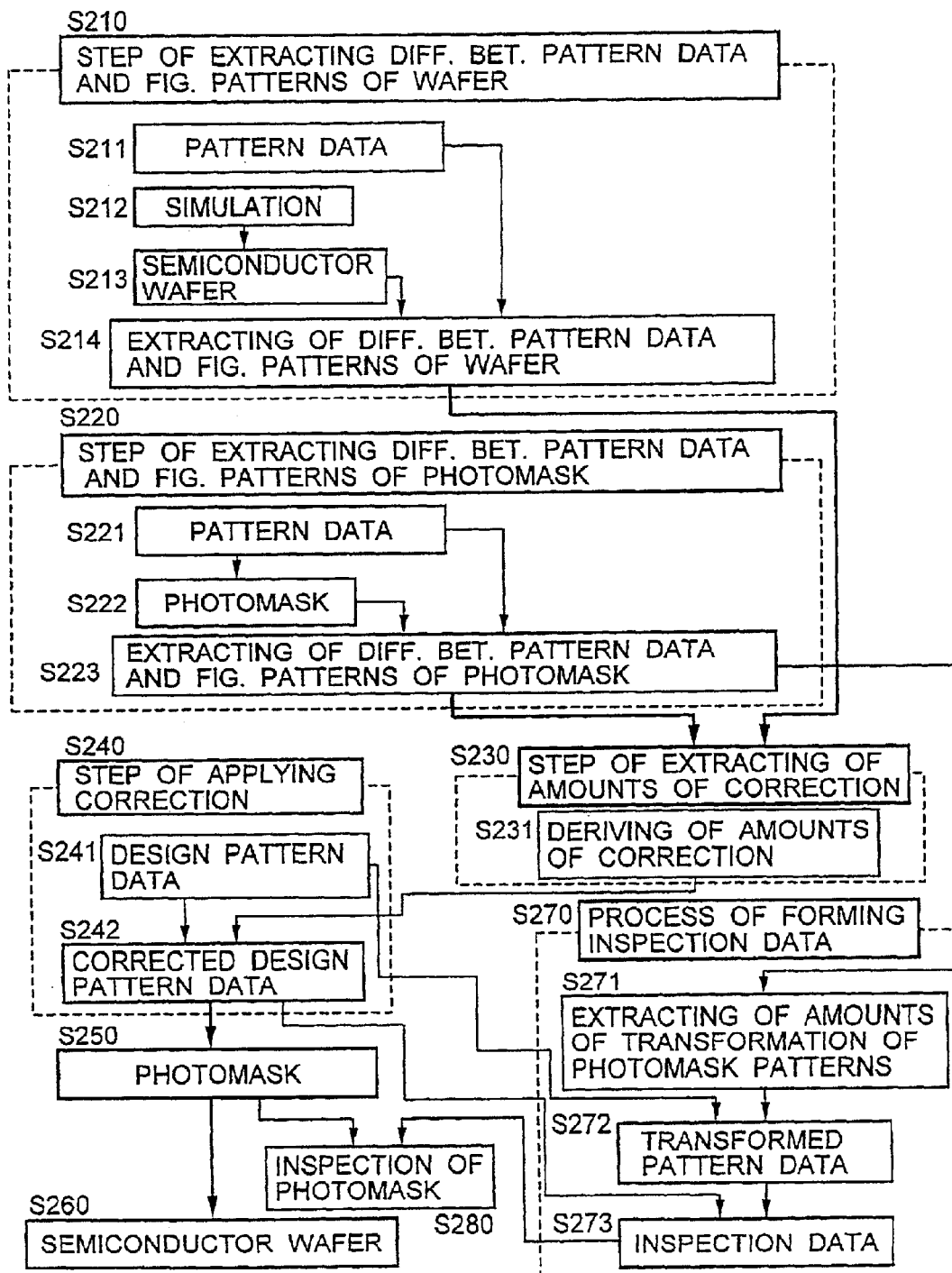
FIG. 2 is a view for illustrating a flow chart of a second example of mode of working of a method for correcting design pattern data of semiconductor circuit of the present invention and an example of the steps of forming inspection data of photomask.
Figure 3:
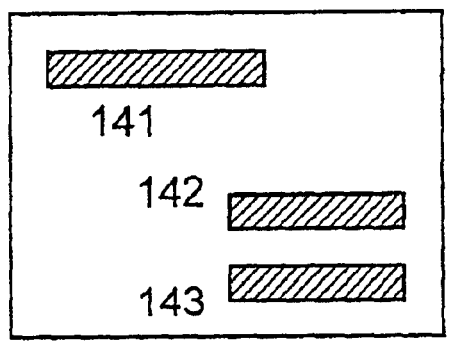
FIGS. 3(a), (b) and (c) are views for illustrating a difference between pattern data and figure patterns formed on a wafer.
Figure 3:
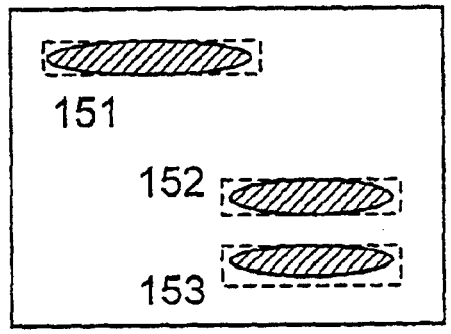
Figure 3:
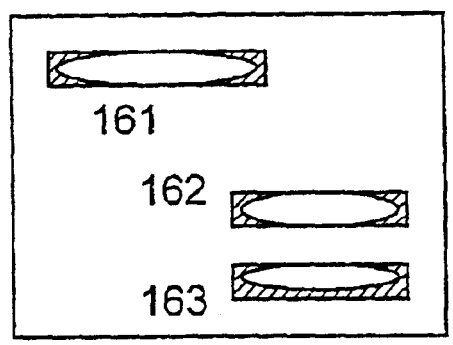
Figure 4:
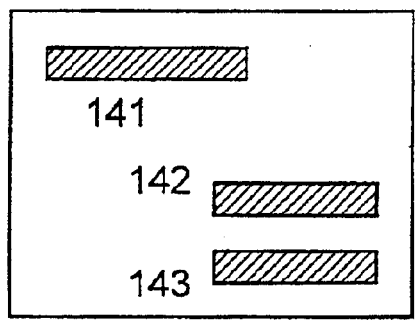
FIGS. 4(a), (b) and (c) are views for illustrating a difference between pattern data and figure patterns formed on a photomask.
Figure 4:
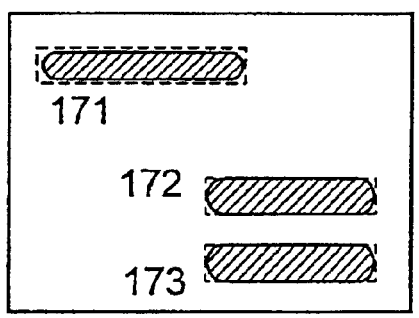
Figure 4:
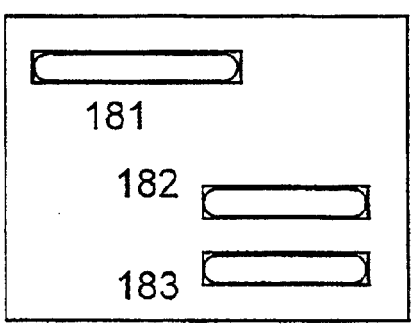
Figure 5:
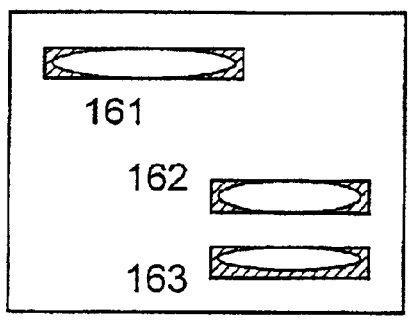
FIGS. 5(a), (b), (c), (d) and (e) are views for illustrating combination of a difference between pattern data and figure patterns formed on a wafer with a difference between pattern data and figure patterns formed on a photomask, corrected design pattern data and data for inspection.
Figure 5:
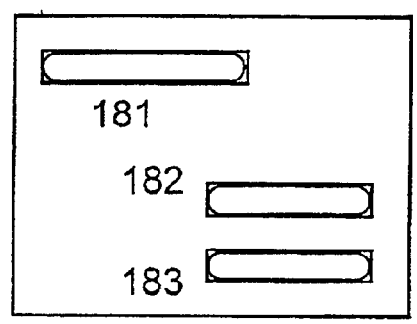
Figure 5:
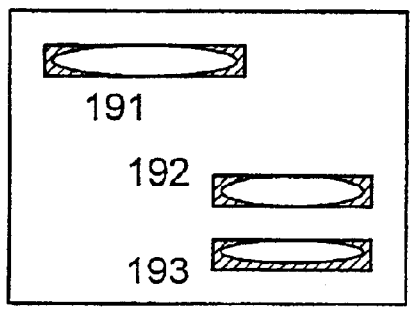
Figure 5:
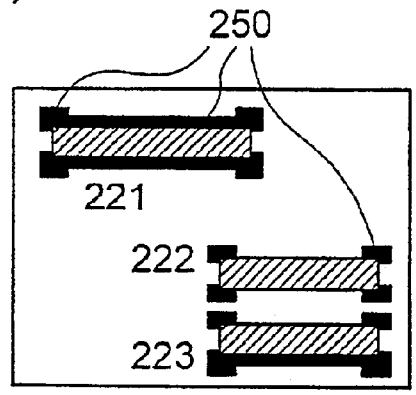
Figure 5:
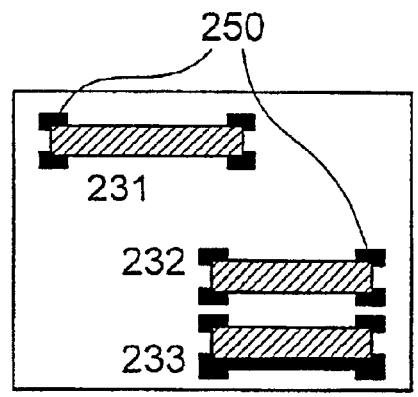
Figure 6:
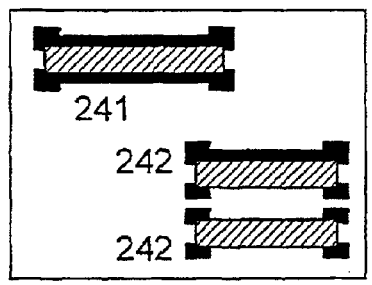
FIGS. 6(a) and (b) are views for illustrating corrected design pattern data and figure patterns formed on a wafer corresponding to the corrected design pattern data.
Figure 6:
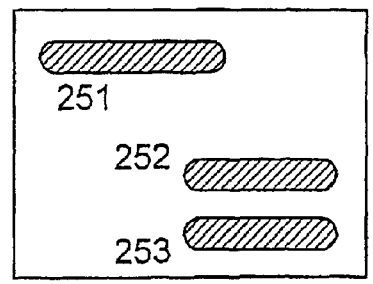
Figure 7:
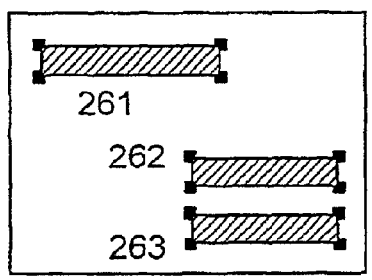
FIGS. 7(a) and (b) are views for illustrating corrected design pattern data and figure patterns formed on a photomask corresponding to the corrected design pattern data.
Figure 7:
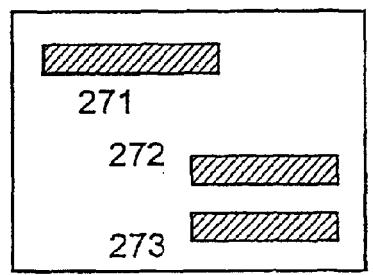
Figure 8:
FIGS. 8(a), (b) and (c) are views for illustrating the correction made according to a difference between pattern data and figure patterns on a wafer and the correction made according to a difference between pattern data and figure pattern of photomask in connection with design pattern data.
Figure 8:
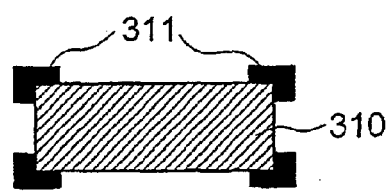
Figure 8:
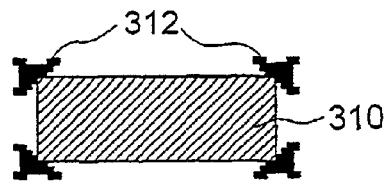

In FIG. 1 and FIG. 2, S110 to S180 and S210 to S280 designate steps of treatment, respectively.

In FIG. 1 through FIG. 5(e) numerals 141 to 143 designate individual pattern data; numerals 151 to 153 designate figure patterns formed on a wafer corresponding to the pattern data, respectively; and numerals 161 to 163 designate a difference between the individual pattern data and the figure patterns formed on a wafer corresponding to the pattern data. Numerals 171 to 173 designate figure patterns formed on photomask corresponding to the pattern data, respectively; numerals 181 to 183 designate a difference between the individual pattern data and the figure pattern formed on a photomask corresponding to the pattern data; and numerals 191 to 193 designate a combination of the difference between the pattern data and the figure patterns formed on the wafer with the difference between the pattern data and the figure patterns formed on the photomask, respectively. Numerals 221 to 223 and numerals 231 to 233 designate individual corrected pattern data, respectively; and numeral 250 designates additional pattern portions.

First, referring to FIG. 1, the first example of a mode of a method for correcting design pattern data of a semiconductor circuit of the present invention is explained.

This example is a method for correcting design pattern data in the fabrication of a semiconductor in which figure patterns are formed on a semiconductor wafer by transferring figure patterns formed on a photomask corresponding to design pattern data designed for a semiconductor circuit to a semiconductor wafer by exposure.

The method for correcting design pattern data comprises the step (S110) of extracting a difference between particular pattern data and figure patterns formed on a wafer, wherein the figure patterns corresponding to the pattern data comprised of test pattern data or the pattern data comprised of test pattern data and design pattern data are formed on a semiconductor wafer. The figure patterns are formed using an ideal photomask having a high fidelity in which there is no difference or very small difference between pattern data and figure patterns formed on a photomask. According to the specific method for fabricating a semiconductor, the measurement of the figure patterns formed on a semiconductor wafer is carried out, by which a difference between the pattern data and the figure pattern formed on the semiconductor wafer is extracted. A step (S120) extracts a difference between the pattern data and figure patterns formed on a photomask, wherein figure patterns corresponding to the pattern data are formed on a photomask, using the pattern data and according to the specified method for fabricating a photomask and the measurement of the figure patterns formed on a photomask is carried out, by which a difference between the pattern data and the figure pattern formed on the photomask is extracted. A step (S130) derives correction amounts, wherein the correction amount for transforming the shape of the pattern data is derived so as to decrease a difference between the pattern data and the figure pattern formed on the semiconductor wafer corresponding to the pattern data, on the basis of the information on a difference extracted from the step for extracting the difference between the pattern data and the figure patterns formed on the photomask and the step for extracting a difference between pattern data and figure patterns formed on the semiconductors wafer. A step (S140) applies the correction of design pattern data, wherein the shape of design pattern data is corrected using the correction amounts derived from the design pattern data so that the corrected design pattern data is generated.

In order to explain the present example so that it can be understood easily, a case where design data is set to pattern data as shown in FIG. 3(a), corrected design pattern data is generated by correcting the design data and figure patterns are formed on a photomask using the corrected design pattern data.

First, the step (S110) of extracting a difference between pattern data and figure patterns formed on a wafer is carried out.

A difference between pattern data and figure patterns formed on a wafer corresponding to the pattern data is extracted, assuming that a photomask used for the fabrication of semiconductor wafer is an ideal photomask ideally fabricated so that a very highly fidelity photomask can be fabricated practically.

Such a photomask is fabricated by a method different from ordinary work.

When using pattern data shown in FIG. 3(a), figure data formed on a wafer corresponding to the pattern data shown in FIG. 3(a) is as shown in FIG. 3(b), wherein corners of the figure patterns formed on a wafer corresponding to the pattern data are rounded, the length thereof is shortened, further a difference in a width of pattern is generated on the position of figure pattern or according to arrangement of figure as figure 153. Assuming a photomask to be an ideal photomask, a difference between pattern data shown in FIG. 3(a) and figure data formed on a wafer corresponding to the pattern data shown in FIG. 3(b) is as shown in FIG. 3(c).

On the other hand, the step (S120) of extracting a difference between pattern data and figure patterns formed on a photomask is carried out.

A difference between pattern data and figure patterns formed on a photomask is extracted.

In this case figure patterns corresponding to the pattern data shown in FIG. 4(a) (this pattern data is the same as pattern data shown in FIG. 3(a)) are formed according to the specified method for fabricating a photomask. The measurement of the figure patterns formed on the photomask is carried out, by which a difference between the pattern data and the figure patterns formed on the photomask is extracted.

When using pattern data shown in FIG. 4(a), figure patterns formed on a photomask corresponding to the pattern data shown in FIG. 4(a), are as shown in FIG. 4(b). Corners of the figure patterns formed on the photomask corresponding to the pattern data is rounded, respectively, and a difference in a width of pattern is generated on the position of the figure pattern or according to arrangement of the figure. A difference between pattern data shown in FIG. 4(a)

and the figure patterns formed on a photomask shown in FIG. 4(b) corresponding to the pattern data is as shown in FIG. 4(c).

Then, the step (S130) of deriving correction amounts is carried out, wherein the correction amounts for transforming the shape of the pattern data shown in FIG. 3(a) (this shape is the same as that shown in FIG. 4(a)) so as to decrease a difference between the pattern data shown in FIG. 3(a) (this data is the same as pattern data shown in FIG. 4(a) and the figure pattern formed on the semiconductor corresponding to the pattern data) are derived.

Combining a difference between the pattern data shown in FIG. 5(b) (this pattern data is the same as that shown in FIG. 4(c)) and the figure data formed on the photomask corresponding to the pattern data shown in FIG. 5(b) and a difference between the pattern data shown in FIG. 5(a) (this pattern data is the same as that shown in FIG. 3(c)) and the figure data on the wafer corresponding to the pattern data shown in FIG. 5(a) is carried out so that figure data, which is called combined figure data, and overlapping information as shown in FIG. 5(c) can be obtained as combination treatment information.

Each figure shown in FIG. 5(c) is the summation of FIG. 5(a) and FIG. 5(b).

Also, parts in which figure patterns shown in FIG. 5(a) and figure patterns shown in FIG. 5(b) are overlapped can be obtained.

Numeral 191 designates a figure pattern formed on a wafer corresponding to design pattern data 141, which shows that both ends arranged in the long edge of design pattern data 141 become thinner in the figure pattern 191 formed on a wafer and the figure pattern 191 has round corners.

Numeral 193 designates a figure pattern formed on a wafer corresponding to design pattern data 143, which shows that both ends arranged in the long edge of design pattern data 143 become thinner in the figure pattern 193 formed on a wafer corresponding to design pattern data 143, and the figure pattern 193 has round corners.

The figure pattern shown in FIG. 5(a) and the figure pattern shown in FIG. 5(b) are overlapped in corners of the figure patterns 192, 193 and corners of the figure patterns 192, 193 become more round as compared with corners of figure pattern 191, which is understood from the information on overlapping.

Correction amounts are determined at each point necessary to correct the design pattern data according to rules predetermined on the basis of figure information of the summation and the information on overlapping.

The ratio of addition of weight of a difference between pattern data and a figure pattern formed on a wafer to that of a difference between pattern data and figure pattern formed on a photomask is not really 1:1. It is necessary to determine the ratio of weight of a difference between pattern data and a figure pattern formed on a wafer to that of a difference between pattern data and the figure pattern formed on a photomask, considering influence on the measurements of figure patterns formed on a semiconductor wafer and others.

Then, step (S140) of applying the correction of design pattern data is carried out, wherein the shape of the design pattern data is corrected so that corrected design pattern data is generated.

Correction of the design pattern data is given at each place at which the correction of design pattern data is needed using the correction amounts derived in the step S130 of deriving correction amount so that the corrected design pattern data can be obtained.

The corrected design pattern data is as shown in FIG. 5(d).

In FIG. 5(d), rectangles are added to the vertices of design patterns on the basis of area obtained by combining of differences shown in FIG. 5(c) against roundness of vertices of design patterns and correction is given so that long edge of design patterns are thickened against a difference in which the design pattern becomes thinner according to the position of long edges of the design pattern.

A method of correction is really determined according to the relation between the method of correction and an effect of correction. Therefore, a method of correction depends on rules of design, a method for fabricating a photomask and a method for fabricating a semiconductor wafer.

A photomask is fabricated using corrected design pattern data obtained in such a way (S150), and further a desired figure pattern can be formed on a wafer using the photomask (S160).

As mentioned hereinabove, corrected design pattern data can be obtained, wherein figure patterns formed on a wafer are various and the amounts of data of design pattern data are numerous.

Accordingly, it is preferable at a practical level to obtain correction amounts from test pattern data generated assuming that various figure patterns are formed on a wafer and obtain corrected design pattern data in which design pattern data are corrected from correction amounts obtained by the use of test pattern data.

Then, referring to FIG. 2, a second example of mode of working of a method for correcting design pattern data of semiconductor circuit of the present invention is briefly explained.

The present example is also a method for correcting design pattern data, in the fabrication of semiconductor in which figure patterns are formed on a semiconductor wafer using design pattern data designed for semiconductor circuit and by transferring figure patterns of photomask corresponding to the design pattern data designed for semiconductor circuit from the photomask to a semiconductor circuit by exposure. The present example differs from the first example in the content of the step of extracting a difference between pattern data and figure patterns formed on a wafer.

The second example is the same as the first example except the above-mentioned fact.

Figure patterns formed on a semiconductor wafer corresponding to particular pattern data are obtained by simulation on the assumption that the pattern of the semiconductor is fabricated with high fidelity to the pattern data, in the step of extracting a difference between pattern data and figure patterns formed on a wafer.

Then, a difference between the pattern data and the figure patterns of the semiconductor wafer corresponding to the pattern data is extracted from the result of the simulation corresponding to the pattern data.

In the present example, a method for correcting design pattern data is preferable at a practical level, in which test pattern data are used as the fixed pattern data in the same manner as in the first example, in the step (S210) of extracting a difference between pattern data and figure patterns formed on a wafer and the step (S220) of extracting a difference between patterns data and the figure patterns formed on a photomask, by which correction amounts are derived to give the correction design pattern data.

The others are the same as the first example. Therefore, the explanation on the others is omitted.

Then, referring to FIG. 1, the step of inspecting data for inspecting a photomask fabricated by corrected design pattern data in the first example or in the second example is briefly explained.

As mentioned hereinabove, corrected design pattern data (S142 or S242) are generated and a photomask (S150 or S250) is fabricated using the generated corrected design pattern data, wherein inspection data (S173 or S273) are generated as follows.

First, amounts of transformation of figure patterns formed on a photomask to pattern data are extracted from the information obtained in the step of extracting a difference between pattern data and figure patterns of photomask (S120 or S220) pattern in the first example or in the second example (S171, S271).

Then, a transformed design pattern data for inspecting a fabricated photomask is formed, in which the transformed design pattern data to which design pattern data is transformed against the corrected design pattern data generated in the step of applying correction of design pattern data, are formed on the basis of transformation amounts extracted in the step of extracting transformation amounts for the photomask (S172, S272).

Then, inspection data for inspecting the photomask can be formed from transformed design pattern (data) using the corrected design pattern data.

As mentioned hereinabove, design patterns are corrected in consideration of an appearing difference between pattern data and figure patterns formed on the photomask and an apparent difference between pattern data and figure patterns formed on the semiconductor wafer. Accordingly, a comparative pattern for inspecting a photomask is not a corrected design pattern, but is needed to be a pattern in which only a difference between pattern data and figure patterns formed on a wafer is considered.

FIG. 5(e) shows an example of patterns for inspecting a photomask corresponding to corrected design pattern shown in FIG. 5(d).

In the case where patterns formed on a photomask become thinner as pattern 231 as compared with a pattern 221 shown in FIG. 5(d), the thickness of pattern 221 must be compared to that behind correction since the corrected design pattern is corrected to become thicker as shown with pattern 221 shown in FIG. 5(d) so that pattern formed on the photomask is corrected.

When inspection is carried out for a few roundness of corners appearing as a difference between design patterns and patterns of photomask as shown in FIG. 5(b) (FIG. 4(c)), the difference is obtained by algorithms of inspection equipment so that problem will not occur.

The present invention enables the provision of a method for correcting design pattern data for a semiconductor circuit, wherein, recently, in the middle of miniaturization and a high density of photomask pattern, the technique of correction in which the correction of the design pattern data in the formation of fine patterns formed on a semiconductor wafer is associated with the correction of design patterns in the production of photomask.

Namely, the present invention enables the provision of a method for inspecting design pattern data of a semiconductor circuit in which amounts of data are not enormous and the treatment time is practical.

At the same time, the present invention enables the provision of a photomask and a method for inspecting the photomask produced using figure data (pattern data) in which the above-mentioned data correction is given.

Accordingly, the production of the photomask and the step of inspecting the photomask can be established, in which the objective figure patterns on a wafer can be formed faithfully to original design pattern data by which the provision of such a photomask is made possible at a practical level.

What is claimed is:

1. A method for correcting design pattern data in fabrication of a semiconductor in which figure patterns are formed on a semiconductor wafer using design pattern data designed for a semiconductor circuit and transferring the figure patterns of a photomask corresponding to the design pattern data from the photomask to the semiconductor wafer by exposure, said method comprising:

(a) extracting a data/wafer difference by:

forming said figure patterns on the semiconductor wafer corresponding to a particular pattern data made up of (1) test pattern data or (2) test pattern data and said design pattern data by use of a photomask having high fidelity in which there is no difference or very small difference between said design pattern data and said figure patterns according to a specified method of fabricating a semiconductor; and measuring said figure patterns formed on the semiconductor wafer and extracting the data/wafer difference between said particular pattern data and said figure patterns of the semiconductor wafer;

(b) extracting a data/mask difference by:

forming said figure patterns corresponding to said particular pattern data on the photomask by use of said particular pattern data according to a specified method of fabricating a photomask; and measuring said figure patterns formed on the photomask, and thereby extracting the data/mask difference between said particular pattern data and said figure patterns of the photomask;

(c) deriving an amount of correction to transform the shape of said particular pattern data on the basis of said data/mask difference and said data/wafer difference, in such a manner that the difference between said particular pattern data and the corresponding figure patterns of the semiconductor wafer becomes smaller; and (d) correcting the shape of the design pattern data by use of the derived amount of correction to generate corrected design pattern data.

2. A photomask of the present invention wherein the photomask is fabricated using the corrected design pattern data of claim 1.

3. A method for generating inspection data for inspection of the fabricated photomask using the corrected design pattern data of claim 1, wherein the method for generating pattern data for inspection of the photomask comprises the steps of: (e) extracting amounts of transformation of the photomask patterns, wherein the amounts of transformation of photomask patterns against pattern data are extracted from the data/mask difference of claim 1; (f) forming transformed pattern data by transforming the design pattern data against the amounts of transformation of the photomask; and (g) generating inspection data, wherein the inspection data for inspecting the fabricated photomask is formed from said transformed pattern data, using the corrected design pattern data.

4. A method for inspecting photomask wherein the photomask fabricated using the corrected design pattern data is inspected using the inspection data of the photomask according to claim 3, wherein the inspection data for inspection of the photomask is compared with the fabricated photomask.

5. A method for correcting design pattern data in fabrication of a semiconductor as recited in claim 1, wherein the ratio of the data/wafer difference and the data/mask difference in the step of deriving an amount of correction is not 1:1.

6. A method for correcting design pattern data in fabrication of a semiconductor in which figure patterns are formed on a semiconductor wafer using design pattern data designed for a semiconductor circuit and transferring the figure patterns of a photomask corresponding to the design pattern data from the photomask to the semiconductor wafer by exposure, said method comprising;

(A) extracting a data/wafer difference by:

obtaining said figure patterns of the semiconductor wafer corresponding to a particular pattern data made up of (1) test pattern data or (2) test pattern data combined with said design pattern data by simulation by assuming that the photomask is fabricated from said design pattern data with fidelity; and extracting a difference between said particular pattern data and said figure patterns of the semiconductor wafer corresponding to the result of the simulation;

(B) extracting a data/mask difference by:

forming said figure patterns corresponding to said particular pattern data on the photomask by use of said particular pattern data according to a specified method of fabricating a photomask; and measuring said figure patterns formed on the photomask, thereby extracting a difference between said particular pattern data and said figure patterns of the photomask;

(C) deriving an amount of correction to transform the shape of said particular pattern data on the basis of said data/mask difference and said data/wafer difference in such a manner that the difference between said particular pattern data and the corresponding figure patterns of the semiconductor wafer becomes smaller; and (D) correcting the shape of the design pattern data by use of the amount of correction to generate corrected design pattern data.

7. A photomask of the present invention wherein the photomask is fabricated using the corrected design pattern data of claim 6.

8. A method for correcting design pattern data in fabrication of a semiconductor as recited in claim 6, wherein the ratio of the data/wafer difference and the data/mask difference in the step of deriving an amount of correction is not 1:1.

9. A method for generating inspection data for inspection of a fabricated photomask using corrected design pattern data, said method comprising:

(a) extracting a data/wafer difference by:

forming wafer figure patterns on a semiconductor wafer corresponding to a particular wafer pattern data made up of (1) test pattern data or (2) test pattern data and said wafer design pattern data by using a photomask having high fidelity in which there is no difference or very small difference between said design pattern data and photomask figure patterns according to a specified method of fabricating a semiconductor; and measuring said wafer figure patterns formed on the semiconductor wafer and extracting the data/wafer difference between said particular pattern data and said wafer figure patterns of the semiconductor wafer;

(b) extracting a data/mask difference by:

forming photomask figure patterns corresponding to said particular pattern data on the photomask by use of said particular pattern data according to a specified method of fabricating a photomask; and measuring said photomask figure patterns formed on the photomask, and thereby extracting the data/mask difference between said particular pattern data and said photomask figure patterns of the photomask;

(c) deriving an amount of correction to transform the shape of said particular pattern data on the basis of said data/mask difference and said data/wafer difference, in such a manner that the difference between said particular pattern data and the corresponding figure patterns of the semiconductor wafer becomes smaller;

(d) correcting the shape of the design pattern data by use of the derived amount of correction to generate the corrected design pattern data;

(e) extracting amounts of transformation of the photomask patterns, wherein the amounts of transformation of the photomask patterns against the pattern data are extracted from the data/mask difference;

(f) forming transformed pattern data by transforming the design pattern data against the amounts of transformation of the photomask; and (g) generating inspection data, wherein the inspection data for inspecting the fabricated photomask is formed from said transformed pattern data using the corrected design pattern data.

10. A method for generating inspection data for inspection of a fabricated photomask as recited in claim 9, wherein the ratio of the data/wafer difference and the data/mask difference in the step of deriving an amount of correction is not 1:1.

* * * * *